United States Patent
Ridener

[11] Patent Number: 6,054,647
[45] Date of Patent: Apr. 25, 2000

[54] GRID MATERIAL FOR ELECTROMAGNETIC SHIELDING

[75] Inventor: Jerry W. Ridener, Corbin, Ky.

[73] Assignee: National-Standard Company, Niles, Mich.

[21] Appl. No.: 08/979,190

[22] Filed: Nov. 26, 1997

[51] Int. Cl.⁷ .................................................. H05K 9/00
[52] U.S. Cl. .................................. 174/35 MS; 361/816; 361/818
[58] Field of Search ............................ 174/35 R, 35 GC, 174/35 MS; 361/816, 818, 800; 427/576

[56] References Cited

U.S. PATENT DOCUMENTS

| | | | |
|---|---|---|---|
| 2,585,054 | 2/1952 | Stachura | 174/36 |
| 3,150,792 | 9/1964 | Bright | 220/9 |
| 3,426,940 | 2/1969 | Broerman | 220/83 |
| 3,931,908 | 1/1976 | Cheyney | 220/71 |
| 4,017,967 | 4/1977 | Wells et al. | 29/611 |
| 4,215,796 | 8/1980 | Johnston et al. | 220/306 |
| 4,505,658 | 3/1985 | Muller | 425/117 |
| 4,593,736 | 6/1986 | Morita | 150/147 |
| 4,631,214 | 12/1986 | Hasegawa | 428/68 |
| 4,692,809 | 9/1987 | Beining et al. | 358/247 |
| 4,785,136 | 11/1988 | Mollet et al. | 174/35 R |
| 4,839,397 | 6/1989 | Lohmar et al. | 521/159 |
| 4,863,789 | 9/1989 | Arai | 428/253 |
| 4,872,554 | 10/1989 | Quernemoen | 206/454 |
| 4,881,997 | 11/1989 | Hatch | 156/66 |
| 4,897,231 | 1/1990 | Scheurer et al. | 264/46.7 |
| 4,900,877 | 2/1990 | Dubrow et al. | 174/35 GC |
| 4,931,326 | 6/1990 | Weil | 428/35.8 |
| 4,935,085 | 6/1990 | Maruyama et al. | 156/245 |
| 4,948,007 | 8/1990 | Berg et al. | 220/5 A |
| 4,963,083 | 10/1990 | Stalter, Sr. et al. | 425/125 |
| 5,012,041 | 4/1991 | Sims et al. | 174/35 MS |
| 5,020,687 | 6/1991 | Seizert | 220/645 |
| 5,028,739 | 7/1991 | Keyser et al. | 174/35 GC |
| 5,073,318 | 12/1991 | Rohrlach et al. | 264/46.5 |
| 5,104,597 | 4/1992 | Paulsen | 264/46.5 |
| 5,128,085 | 7/1992 | Post et al. | 264/254 |
| 5,219,499 | 6/1993 | Timuska | 264/46.4 |
| 5,226,210 | 7/1993 | Koskenmaki et al. | 29/527.5 |
| 5,239,125 | 8/1993 | Savage et al. | 174/35 MS |
| 5,273,597 | 12/1993 | Kumagai et al. | 156/79 |
| 5,309,321 | 5/1994 | Olla et al. | 361/714 |
| 5,338,896 | 8/1994 | Danforth | 174/35 R |
| 5,354,950 | 10/1994 | Golane | 174/35 MS |
| 5,386,345 | 1/1995 | Matsuzaki et al. | 361/816 |
| 5,436,803 | 7/1995 | Annis et al. | 361/818 |
| 5,548,083 | 8/1996 | Yamamoto | 174/35 GC |
| 5,565,656 | 10/1996 | Mottahed | 174/35 GC |
| 5,587,259 | 12/1996 | Dopp et al. | 429/233 |
| 5,597,979 | 1/1997 | Courtney et al. | 174/35 R |
| 5,637,117 | 6/1997 | Dopp et al. | 29/623.1 |
| 5,650,246 | 7/1997 | Dopp et al. | 429/233 |
| 5,656,395 | 8/1997 | Dopp et al. | 429/233 |

FOREIGN PATENT DOCUMENTS

| | | |
|---|---|---|
| 62-062719 | 3/1987 | Japan. |
| 2279316 | 11/1990 | Japan. |
| 6226776 | 8/1994 | Japan. |
| 7007284 | 1/1995 | Japan. |
| 9223885 | 8/1997 | Japan. |

OTHER PUBLICATIONS

National–Standard Industrial Wire Cloth Brochure, 1984 No Month.
National–Standard You've Got Our Number Brochure, 1988 No Month.
National–Standard NickelPly Wire Brochure, 1983 No Month.
National–Standard Translating Technology Brochure, 1986 No Month.
Database WIP Week 8543 Derwent Publications Ltd., London, GB; XP002102774 & JP 60 177699 A (Showa Denko KK), 11 Sep. 1985 "Abstract."

*Primary Examiner*—Kristine Kincaid
*Assistant Examiner*—Ronnie Mancho
*Attorney, Agent, or Firm*—Emrich & Dithmar

[57] ABSTRACT

A grid material for incorporation with a molded housing to provide electromagnetic and radio frequency shielding is described. The unitary grid material includes a calendered and annealed nickel-coated grid material containing between about 1 to 20 percent by weight nickel. Methods of making the unitary grid material are described.

7 Claims, 3 Drawing Sheets

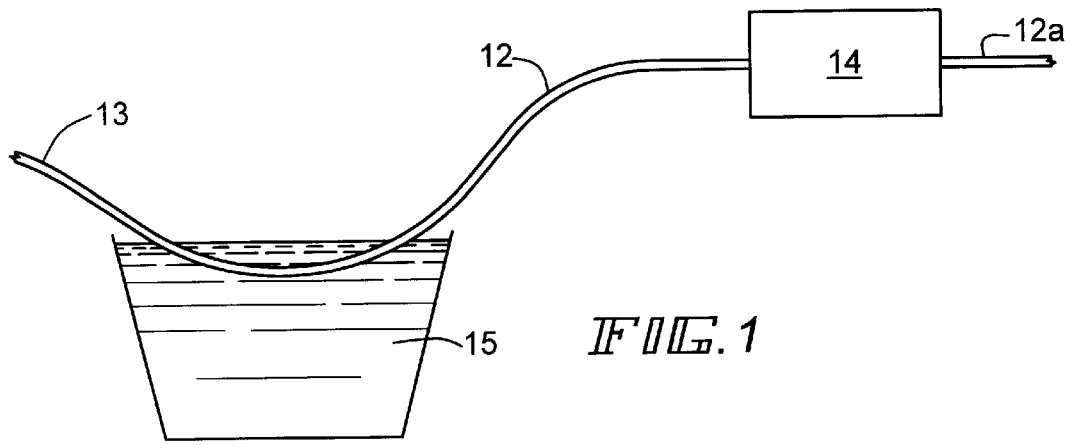
FIG. 1
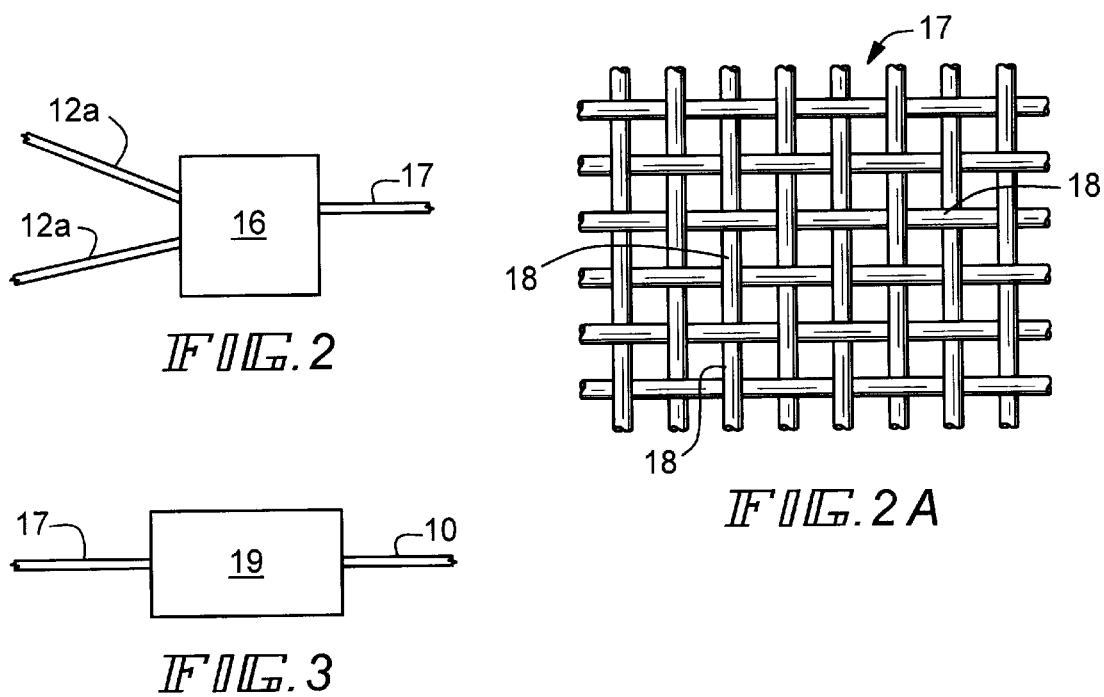
FIG. 2
FIG. 2A
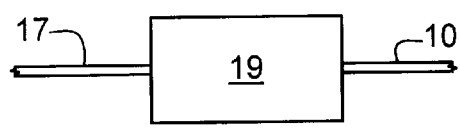
FIG. 3
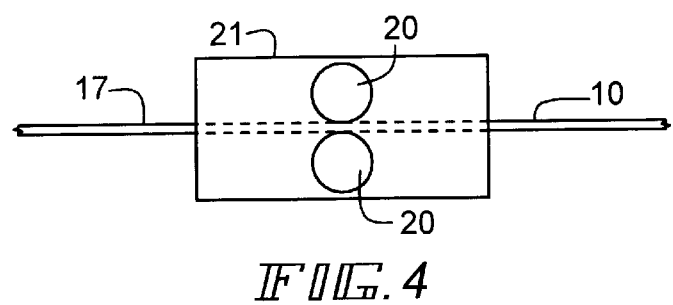
FIG. 4

GRID MATERIAL FOR ELECTROMAGNETIC SHIELDING

BACKGROUND OF THE INVENTION

The present invention relates to a novel grid material that is capable of being joined with a plastic molding to provide a shielding structure for shielding electromagnetic waves from an electronic device. Specifically, the grid material is a nickel-coated mesh-like material or substrate that is annealed and calendared together to provide a bonded unitary grid structure. The grid material provides a conductor in the shielded structure and provides a flexible grid material which readily permits the insertion and placement with respect to an electrical mold cavity to permit the insert molding of the shielding housing.

Electromagnetic interference (E.M.I.) shielding structures exist to provide protection for an electronic instrument or device from electromagnetic energy, including radio frequency interference (R.F.I.). The shielding structures hopefully provide protection for the electronic device by preventing electromagnetic wave energy from penetrating the device, as well as escaping from the device. However, electromagnetic shielding products have generally been made by the formation of sheet metal boxes; conductive paints applied to a plastic housing, die cast parts to construct a housing and filled resins containing metal fibers. However, such prior art sheet metal devices for providing shielding structures have found only limited application because of the difficulties of weight restrictions in shielding housings, the inability to make round shapes, noise problems and the requirement of multiple parts. Conductive paints include electroplating metal onto a plastic, a technique which requires a second processing step, provides poor performance, is cost prohibitive, presents environmental problems and is susceptible to chipping and flaking. Filled resins are very expensive and destroy insert molding tooling and exhibit poor shielding properties. For example, in utilizing a die cast or plate material, the resultant shielding housing used to enclose and shield an electronic device requires external connections and supplemental shielding at the joints or corners of the enclosure to provide the box-like enclosure. Such assembly techniques are expensive and time consuming and oftentimes result in a structure which does not properly shield the enclosed device. Accordingly, such shielding structures and approaches have found only limited acceptance. Finally, such shielding structures may require is complex conductive junctions and connections between shielding panels, assembly techniques that are expensive and time consuming and which oftentimes result in unacceptable shielding housings.

SUMMARY OF THE INVENTION

One object of the present invention is to provide a novel grid material or substrate which is capable of being utilized in conjunction with an injection mold to provide the molding of box-like shielding structures or housings.

It is a further object of the present invention to provide a unitary grid material that is comprised of a nickel coating of between approximately 1 to 20 weight percent nickel of the grid substrate material and which is incorporated on a mesh or screen material that has been annealed and calendered to provide the novel unitary grid material or substrate.

It is yet another object of the present invention that the nickel-coated grid material possess sufficient strength and sufficient flexibility to permit use with an injection mold such that the resultant molding provides a shielding structure having a base and integrally molded sidewalls.

It is still a further object of the present invention to provide a shielding housing or structure which contains a flexible grid material incorporated therewith which is non-reactive and non-corrosive with respect to the plastic molding.

It is still another object of the present invention to provide a unitary grid material or substrate made by the steps of depositing a nickel coating onto a metal rod stock, drawing the coated rod stock to a desired wire size, weaving the coated drawn wire into a mesh or screen, annealing the nickel-coated mesh or screen to partially bond the intersecting points together and calendering the annealed bonded material to compress, flatten and size the grid material to complete the bonding at the intersecting points of the grid substrate.

The mesh-like grid structure of the present invention is particularly useful in incorporation with a molded housing for shielding electromagnetic waves propagating into and exiting from various type electronic devices. The mesh-like grid structure or substrate material is, preferably, prepared by electroplating and depositing a nickel coating onto a steel rod. The nickel-coated steel rod is then drawn to a predetermined wire size which corresponds to the desired diameter wire from which a mesh or screen is desired to be woven. Multiple nickel-coated drawn and sized wires are then directed to a loom which weaves the nickel-coated wires into a wire cloth, such as a mesh or screen.

The nickel-coated mesh or screen may be stored for subsequent treatment or may be immediately treated by annealing in a reducing furnace between a temperature of about 1630–1680° F. so that the strands of the mesh or screen are partially fused or bonded together at each intersecting cross-over point of the annealed mesh or screen. Thereafter, the annealed and partially fused or bonded mesh or screen may be either again stored for subsequent treatment or it may be immediately treated by directing the annealed and partially bonded mesh through calendering rollers, to flatten the annealed and partially bonded material to a predetermined thickness while thereby increasing and completing the bonding between the intersecting cross-over points. The increased bonding resulting from the calendering operation provides more integrity to the resultant unitary grid material or substrate and increases the conductivity of the gird substrate. Thereafter, the unitary grid material or substrate may be stored or may be immediately directed through a slitter or cutter to provide the desired dimensions of the grid material or substrate for use with a mold for making the grid shielding housings.

It has been found also that the nickel-coated grid material or substrate is very compatible with plastic moldings in that the nickel-coated grid material does not oxidize when integrally molded to or adjacent the surface of the molding. Because the nickel interstices or cross-over points in the wire grid are fully and completely metallurgically bonded together, the resultant unitary grid material exhibits substantial flexibility and strength, properties which depend upon the drawn wire diameter and the nickel-coating weight of the resultant grid material. For example, the nickel coating weight with respect to the mesh or screen, may range between approximately about 1 to 20 percent depending upon the ultimate application of the grid material. A typical grid material of between about 14×14 up to 100×100 wires per inch and having a wire diameter of between about 0.002 to 0.015 inches have been utilized in making the novel grid material or substrate. Such grid material may be advantageously positioned and inserted into an injection mold to provide a molded shielding housing or structure which provides excellent electromagnetic wave and radio frequency shielding properties. The flexibility of the grid material is determined by the dimension and number of wires per inch in the grid material, as well as by the degree of flattening achieved during calendering of the annealed material. Preferably, the calendering process reduces the thickness or width of the annealed grid material from between about 20 to 30 percent. This compaction or flattening, it is believed, increases the strength of the grid material or substrate by increasing the bond between the cross-over points in the grid material or substrate.

The novel grid material or substrate has particular application as a shielding product when molded in an injection mold. The subsequent molding of the grid substrate to a housing provides a molded shielded housing particularly useful in preventing electromagnetic waves from penetrating into the housing or escaping from the housing.

The present invention consists of certain novel features and structural details hereinafter fully described, illustrated in the accompanying drawings, and specifically pointed out in the appended claims, it being understood that various changes in the details maybe made without departing from the spirit or sacrificing any of the advantages of the present invention.

DESCRIPTION OF THE DRAWINGS

The forgoing description and other characteristics, objects, features and advantages of the present invention will become more apparent upon consideration of the following detailed description, having reference to the accompanying drawings wherein:

FIG. 1 is a schematic view showing the step of electroplating nickel onto a steel rod to provide a coated rod stock and drawing the coated rod stock through a die to provide a proper filament or wire size of the nickel-coated wire in accordance with the present invention;

FIG. 2 is a schematic view illustrating the steps of weaving a mesh or screen material from the nickel-coated drawn wire in accordance with the present invention;

FIG. 2A is an enlarged view of the mesh or screen material obtained during weaving of the nickel-coated drawn wires in accordance with the present invention;

FIG. 3 is a schematic view showing the step of directing the nickel-coated mesh or screen material into and through a reducing furnace for annealing the nickel-coated mesh or screen so that the wires of the mesh or screen are partially fused or bonded together at each intersecting cross-over point to provide a partially bonded and annealed grid material in accordance with the present invention;

FIG. 4 is a schematic view showing the step of calendering is the partially fused and annealed grid material to increase the bond at each intersecting cross-over point to provide the grid material or substrate in accordance with the present invention;

DESCRIPTION OF PREFERRED EMBODIMENTS

Figure 5:
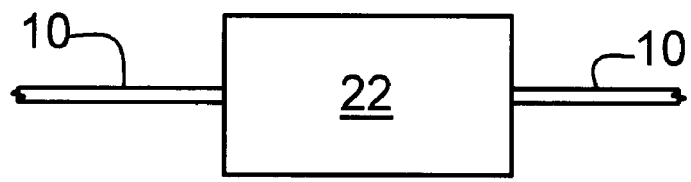
FIG. 5 is a schematic view showing the step of running the calendared grid material or substrate through a slitter or cutter to provide the desired grid material width and dimension in accordance with the present invention.
Figure 6:
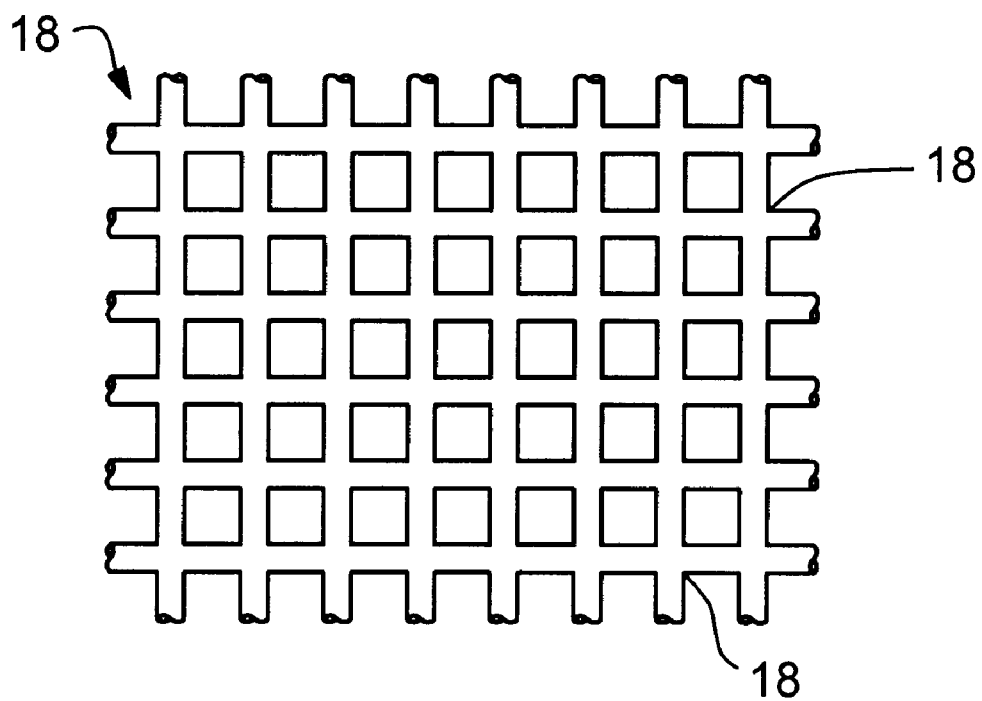
FIG. 6 is an enlarged schematic top plan view of the novel nickel coated grid material or substrate in accordance with the present invention.
Figure 7:
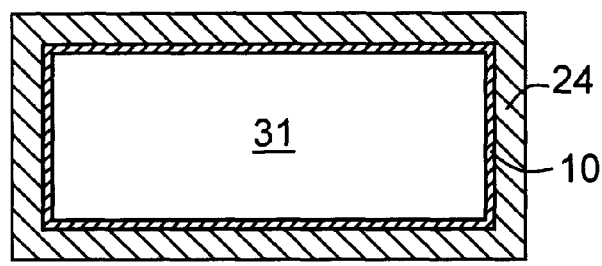
FIGS. 7–10 are schematic views of various types of electronic devices enclosed within a molded shielding housing utilizing the novel grid material in accordance with the present invention.
Figure 8:
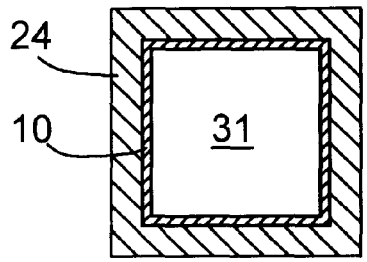
Figure 9:
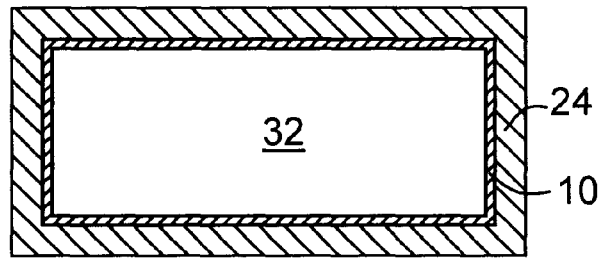
Figure 10:
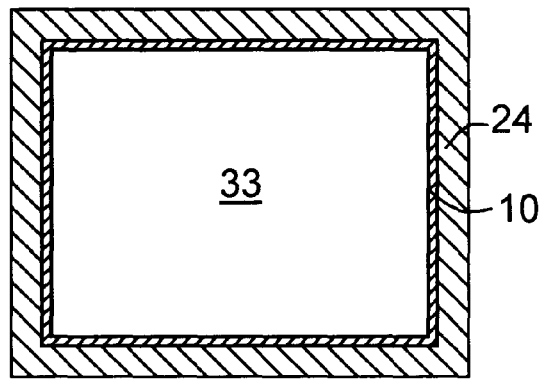

Referring now to the drawings wherein like numerals have been used throughout the several views to designate the same or similar parts, the present invention is directed to a mesh-like grid structure or substrate 10, as shown in FIG. 6, and the method of making the grid substrate, as shown in FIGS. 1–5. The mesh-like grid structure 10 is prepared by electroplating a nickel coating onto a steel rod 13, as shown in FIG. 1. The electroplating solution 15 is comprised of nickel fluoroborate. The time and conditions for the electroplating step determines the amount of nickel coating deposited on the steel rod 13. The nickel-coated steel rod 12 exiting the electroplating bath is then drawn through a die 14 to a desired or predetermined wire diameter to provide a nickel-coated wire 12a. Generally, the range in wire diameter of the drawn nickel-coated wire 12a is between about 0.002 to 0.015 inches, with between about 0.004 to 0.0075 inches being preferred. As shown in FIG. 2, a plurality of the nickel-coated wires 12a are then directed to a loom station 16 which weaves the coated wires 12 into a wire cloth, such as a coated mesh or screen 17, as shown in FIG. 2A. The nickel-coated mesh or screen 17 may be stored for subsequent treatment or it may be immediately directed through an annealing furnace under a reducing atmosphere, such as hydrogen, to raise the temperature of the nickel-coated mesh or screen to a temperature between about 1630° F. to 1680° F. At this temperature the wires in the nickel-coated mesh or screen material 17 are annealed and partially fused or bonded together at each intersecting cross-over point 18 of the nickel-coated screen material 17. Thereafter, the partially welded or bonded mesh or screen material 17 may be either stored for subsequent treatment or may be immediately treated by directing the partially bonded and annealed mesh or screen material 17 through a pair of calendering rollers 20 (FIG. 4) in a calendering station 21 to flatten the annealed and partially bonded mesh or screen material 17 to a predetermined thickness. The step of calendering provides a desired thickness to the final grid material or substrate 10 and increases the strength of the bonding that is provided by the nickel coating 12 between the intersecting cross-over points 18. Such increased bonding provides integrity to the resultant grid material or substrate 10. As shown in FIG. 5, the grid material exiting the calendering rollers (of FIG. 4) may be either placed in storage for subsequent usage or may be immediately directed through a slitter or cutter 22, to provide the desired dimensions and size for the grid material or substrate 10.

In FIG. 6, the nickel-coated grid material or substrate 10 in accordance with the present invention is shown wherein each of the cross-over points 18 is fully bonded to one another by the nickel coating. As pointed out above, the partially fused or bonded annealed grid material 17 entering the calendering station 21 is subjected to a compaction between calendering rollers 20 which reduces the thickness or flattens the annealed partially bonded grid structure 17 to increase the bond at the cross-over points and to reduce the thickness of the annealed grid material by approximately 20 to 30 percent. Thus, a 0.006 inch thick partially bonded grid structure will be compacted to about a thickness of 0.0045 inches.

The mesh-like grid structure or substrate 10 in accordance with the present invention is particularly useful for incorporation with molded housings for shielding electromagnetic waves entering or exiting from various electronic devices. It has been found that the nickel-coated grid material 10 is very compatible with plastic molding in that the nickel-coated grid material does not readily oxidize when it is near or on the surface of the molding. The grid substrate 10 may be positioned on the surface of the molding, within the molding or a combination of both. It is only necessary that the grid substrate be integral with the molded housing. Such a shielding structure or housing 24 (FIGS. 7–10) provides excellent anti-corrosive properties and provides excellent electrical contact and sealing when assembled into box-like shielding devices.

Additionally, the nickel-coated interstices and cross-over points 18 of the grid structure 10 are fully bonded together, a structure and condition which provides uniform electrical contacts within the shielding housing. Moreover, the percent of nickel in the coating with respect to the total weight of the grid material may range from between about 1 to 20 percent, depending upon the desired application of the grid material. A typical grid material of between about 14×14 up to 100×100 wires per inch and having a wire diameter of between about 0.002 to 0.015 inches have been utilized in making the novel grid material or substitute and may be advantageously positioned within an injection mold to provide a molded shielded housing or structure 24.

As the weight percent of the nickel increases in the nickel coated wires 12a, the cost of the ultimately formed grid material 10 increases. Accordingly, the flexibility of the grid material 10 is determined by the size and number of coated wires in the annealed nickel-coated screen or mesh 17 as well as by the degree of flattening attained during calendering of the annealed material 17. It is preferred that approximately a 20 to 30 percent reduction in thickness between the annealed partially bonded material 17 and the final calendared bonded grid material or substrate 10 is desired in accordance with the present invention. The compaction or flattening of the material increases the strength of the grid material and increases the bonding between the cross-over points 18 of the grid material 10.

The nickel coating of the present invention is desirable as a shielding material because nickel sinters and bonds well at a relatively lower temperature, the nickel coating in the ultimate molded plastic part is compatible with the injectable plastic, the nickel coating tends not to oxidize when it is positioned or exposed on the surface of the molded plastic housing and the nickel coating enhances the bonding of the grid matrix at the cross-over points of the grid structure. Thus, the grid material or substrate in accordance with the present invention has particular application as a shielding product when it is incorporated as part of a molded shielding housing 24. The diameter of the drawn wires 12a directed into the weaving machine station may vary in diameter from about 0.002 to 0.015 inches. The smaller the wire diameter, the greater the flexibility of the resultant grid material. Moreover, the use of the novel grid structure in conjunction with molded housings provides excellent shielding structures that are lightweight and durable.

Finally, as schematically shown in cross-section in FIGS. 7–10, the novel molded shielding containers or housings 24 may include box-like structures that enclose radios and CD players 30 (FIG. 7), electronic control units 31, such as airbag control modules, engine control modules, dashboard electronic modules, electronic control units within a vehicle, and industrial control modules (FIG. 8), automotive motors 32, such as windshield wiper motors, window regulation motors and seat adjustment motors (FIG. 9) and electronic devices 33 (FIG. 10), such as computers, printers, cable boxes, disk drive cases, computer screens and monitors, photocopier subassemblies, data transmission equipment, cellular phones and portable electronic medical units.

The present invention has been described with reference to a preferred embodiment as illustrated in the drawings. Modifications and alterations may become apparent to a person skilled in the art after reading and understanding the specification and it is intended that the specification and drawings include modifications and alterations with the scope of the appended claims.

I claim:

1. A woven grid substrate material molded into a plastic housing to provide electromagnetic and radio frequency shielding of an electronic device is comprised of a nickel-coated grid material having each cross-over junction bonded to one another to provide a material substantially free of deformation in the plane it is woven and containing between about 1 to 20 percent by weight of nickel.

2. The grid substrate material in accordance with claim 1, wherein said nickel-coated grid material is comprised of nickel-coated filament wires having a diameter of between about 0.002 to 0.015 inches.

3. The grid substrate material in accordance with claim 2, wherein said nickel-coated filament wires are comprised of nickel-coated carbon steel.

4. The grid substrate material in accordance with claim 1, wherein the preferred weight percent of the nickel in the grid material is about 2 percent.

5. An electromagnetic and radio frequency interference shielding housing for an electronic device comprising:
   an insulating moldable plastic housing, and
   a conductive grid substrate material molded integral with said plastic housing, with said conductive grid substrate material being comprised of a nickel-coated grid substrate material having each cross-over junction bonded to one another to provide a material substantially free of deformation in the plane it is woven and containing between about 1 to 20 percent by weight nickel.

6. The shielding housing in accordance with claim 5 wherein the electronic device is selected from a group comprising radios, CD players, airbag control modules, engine control modules, dashboard electronic modules, vehicle control units, industrial control modules, windshield wiper motors, window regulation motors, seat adjustment motors, computers, printers, cable boxes, disk drive cases, monitors, photocopier subassemblies, data transmission equipment, cellular phones and electronic medical units.

7. The grid substrate material in accordance with claim 5, wherein the preferred weight percent of the nickel in the grid material is about 2 percent.

* * * * *